US012554231B2

(12) United States Patent
Fujisawa

(10) Patent No.: US 12,554,231 B2
(45) Date of Patent: Feb. 17, 2026

(54) RADIO-CONTROLLED TIMEPIECE AND METHOD OF CONTROLLING RADIO-CONTROLLED TIMEPIECE

(71) Applicant: SEIKO EPSON CORPORATION, Tokyo (JP)

(72) Inventor: Teruhiko Fujisawa, Shiojiri (JP)

(73) Assignee: SEIKO EPSON CORPORATION (JP)

( * ) Notice: Subject to any disclaimer, the term of this patent is extended or adjusted under 35 U.S.C. 154(b) by 294 days.

(21) Appl. No.: 18/467,183

(22) Filed: Sep. 14, 2023

(65) Prior Publication Data

US 2024/0094682 A1 Mar. 21, 2024

(30) Foreign Application Priority Data

Sep. 15, 2022 (JP) ................. 2022-146830

(51) Int. Cl.
*G04R 20/10* (2013.01)
*H03H 9/10* (2006.01)
*H03H 9/21* (2006.01)

(52) U.S. Cl.
CPC ........... *G04R 20/10* (2013.01); *H03H 9/1021* (2013.01); *H03H 9/21* (2013.01)

(58) Field of Classification Search
CPC ........ G04R 20/10; H03H 9/1021; H03H 9/21; G04G 3/04; G04G 7/00; G04G 3/02; H03B 5/04; H03B 5/36
See application file for complete search history.

(56) References Cited

U.S. PATENT DOCUMENTS

| 5,748,570 A | 5/1998 | Komoda | |
|---|---|---|---|
| 2013/0016589 A1* | 1/2013 | Takada | G04R 20/06 368/47 |
| 2014/0269227 A1* | 9/2014 | Bobev | G04G 7/00 368/159 |

FOREIGN PATENT DOCUMENTS

| JP | H07-311289 A | 11/1995 |
|---|---|---|
| JP | 2000-284077 A | 10/2000 |
| JP | 2009-036673 A | 2/2009 |
| JP | 2018-169298 A | 11/2018 |

* cited by examiner

*Primary Examiner* — Edwin A. Leon
(74) *Attorney, Agent, or Firm* — Harness, Dickey & Pierce, P.L.C.

(57) ABSTRACT

A radio-controlled timepiece includes a first oscillating unit configured to oscillate at a first frequency and output a clock signal, a receiving unit including a second oscillating unit and configured to receive radio waves including time information, frequency of the second oscillating unit being less temperature-dependent than that of the first oscillating unit and the second oscillating unit being configured to oscillate at a second frequency and output a clock signal, a control unit configured to calculate temperature compensation data for the first oscillating unit based on an oscillation frequency of the first oscillating unit obtained using, as a reference, the clock signal output from the second oscillating unit and on the temperature data acquired by a temperature acquiring unit, and a storage unit configured to store the temperature compensation data. The control unit performs temperature compensation for the first oscillating unit based on the temperature compensation data and the temperature data.

7 Claims, 10 Drawing Sheets

RADIO-CONTROLLED TIMEPIECE AND METHOD OF CONTROLLING RADIO-CONTROLLED TIMEPIECE

The present application is based on, and claims priority from JP Application Serial Number 2022-146830, filed Sep. 15, 2022, the disclosure of which is hereby incorporated by reference herein in its entirety.

BACKGROUND

1. Technical Field

The present disclosure relates to a radio-controlled timepiece and a method of controlling a radio-controlled timepiece.

2. Related Art

JP-A-2018-169298 discloses a radio-controlled timepiece that receives a satellite signal from a GPS satellite and corrects the measured time based on the acquired time information, the radio-controlled timepiece including a temperature sensor and performing temperature compensation for an oscillation frequency of a crystal oscillator.

Specifically, upon acquiring temperature data measured by the temperature sensor, the microcontroller transmits a compensation signal to an oscillation circuit to keep the frequency of the clock signal constant. The oscillation circuit changes the oscillation frequency of the crystal oscillator in accordance with the compensation signal, thereby making the oscillation frequency of the crystal resonator and the frequency of the clock signal output from the oscillation circuit constant regardless of temperature.

Since a low-frequency (generally, 32768 Hz) crystal oscillator for a timepiece has a large individual variation and temperature characteristics vary among individual crystal oscillators, the compensation signal for performing the temperature compensation needs to be set for each individual crystal oscillator. JP-A-2000-284077 describes a known solution to address this. Specifically, a compensation signal is set using a dedicated external adjustment device for each individual radio-controlled timepiece.

In known cases, a temperature compensation signal is set by the external adjustment device for each individual radio-controlled timepiece, meaning that generation of temperature compensation data is cumbersome. Thus, there has been a demand for easy generation of temperature compensation data also for the radio-controlled timepieces.

SUMMARY

A radio-controlled timepiece according to the present disclosure includes a first oscillating unit configured to oscillate at a first frequency and output a clock signal, a time measuring unit configured to operate using, as a reference, the clock signal, a receiving unit including a second oscillating unit and configured to receive radio waves including time information, frequency of the second oscillating unit being less temperature-dependent than that of the first oscillating unit and the second oscillating unit being configured to oscillate at a second frequency and output a clock signal, a temperature acquiring unit configured to acquire temperature data, a control unit configured to calculate temperature compensation data for the first oscillating unit based on an oscillation frequency of the first oscillating unit obtained using, as a reference, the clock signal output from the second oscillating unit and on the temperature data acquired by the temperature acquiring unit, and a storage unit configured to store the temperature compensation data calculated, wherein the control unit performs temperature compensation for the first oscillating unit based on the temperature compensation data stored in the storage unit and the temperature data acquired by the temperature acquiring unit.

A control method for a radio-controlled timepiece according to the present disclosure is a control method for a radio-controlled timepiece, the radio-controlled timepiece including: a first oscillating unit configured to oscillate at a first frequency and output a clock signal, a time measuring unit configured to operate using, as a reference, the clock signal, a receiving unit including a second oscillating unit and configured to receive radio waves including time information, frequency of the second oscillating unit being less temperature-dependent than that of the first oscillating unit and the second oscillating unit being configured to oscillate at a second frequency and output a clock signal, a temperature acquiring unit configured to acquire temperature data, and a storage unit configured to store temperature compensation data, the control method including: causing at least part of the receiving unit including the second oscillating unit to operate to output the clock signal from the second oscillating unit, measuring an oscillation frequency of the first oscillating unit using, as a reference, the clock signal output from the second oscillating unit, activating the temperature acquiring unit and measuring the temperature data, calculating the temperature compensation data for the first oscillating unit based on the oscillation frequency of the first oscillating unit and the temperature data, and storing the temperature compensation data in the storage unit.

DESCRIPTION OF EMBODIMENTS

A radio-controlled timepiece 1 of an embodiment will be described below with reference to the drawings. In the present embodiment, a cover glass side of the radio-controlled timepiece 1 is referred to as the front surface side or upper side, and a back cover side is referred to as the back surface side or lower side.

Figure 1:
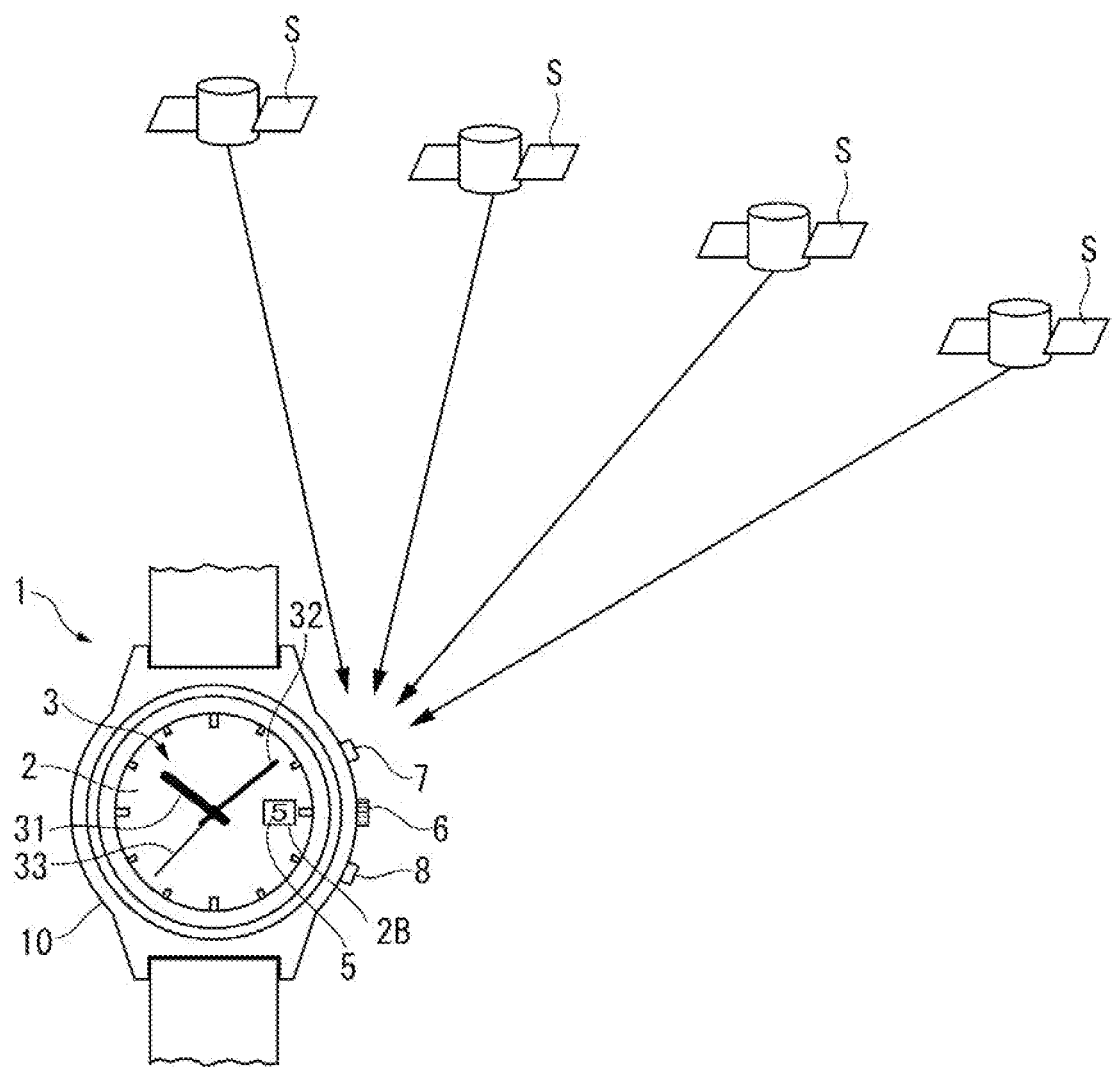
FIG. 1 is an explanatory view illustrating a radio-controlled timepiece of an embodiment and a positioning satellite.

As illustrated in FIG. 1, the radio-controlled timepiece 1 is configured to receive satellite signals from a plurality of positioning satellites S such as GPS satellites and quasi-zenith satellites orbiting the earth in a predetermined orbit, acquiring satellite time information, and correcting internal time information. GPS is an abbreviation for Global Positioning System.

The radio-controlled timepiece 1 includes a case 10 that houses a dial 2, hands 3, a date indicator 5, a movement, and the like. The radio-controlled timepiece 1 also includes a crown 6 and two buttons 7 and 8 as operating units.

The dial 2 is formed of a non-conductive member and has a disk shape. The dial 2 of the present embodiment is made of a polycarbonate resin having a relative dielectric constant of 3.

A rectangular date window 2B is provided at the 3 o'clock position of the dial 2. The date indicator 5 is disposed on the back surface side of the dial 2. The date indicator 5 is visible through the date window 2B. An hour hand 31, a minute hand 32, and a seconds hand 33 that are the hands 3 and the date indicator 5 are driven via a stepping motor 421 and a gear train, which will be described below. Upon transitioning to a temperature compensation data generation mode described below, the seconds hand 33 moves to and stops at a predetermined, specifically, a 5 second, a 10 second, or a 15 second position to indicate that the temperature compensation data generation mode is active. Thus, the seconds hand 33 and the dial 2 form an indication unit that indicates the temperature compensation data generation mode.

Circuit Configuration of Radio-Controlled Timepiece

Figure 2:
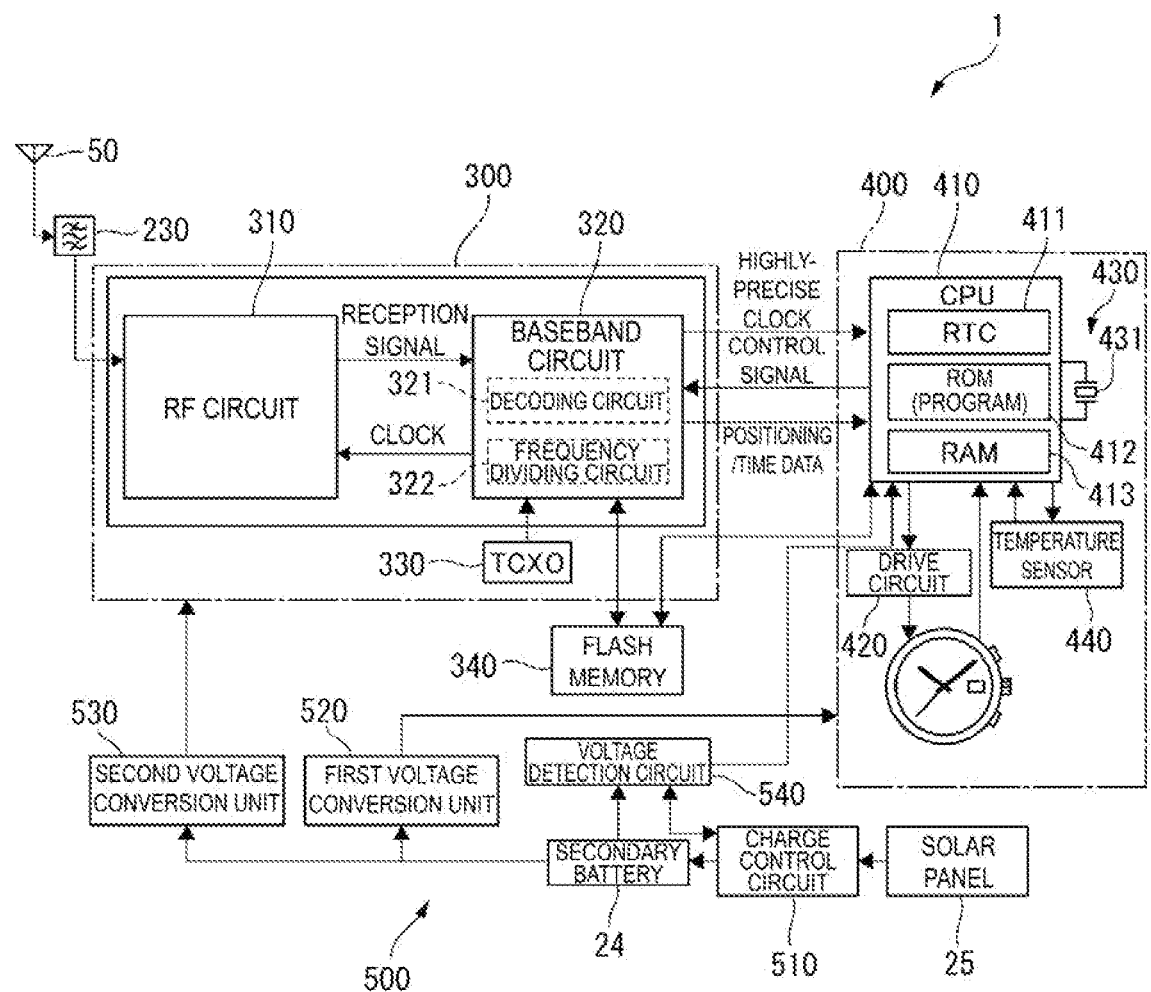
FIG. 2 is a block diagram illustrating a circuit configuration of the radio-controlled timepiece.

FIG. 2 is a block diagram illustrating a circuit configuration of the radio-controlled timepiece 1.

The radio-controlled timepiece 1 includes a GPS receiving unit 300, a control indication unit 400, and a power supply unit 500 that are disposed on a circuit board.

GPS Receiving Unit

The GPS receiving unit 300 receives satellite signals from GPS satellites via a planar antenna 50 and an SAW filter 230, and processes the signals. The SAW filter 230 is a band-pass filter through which 1.5 GHz satellite signals pass. An LNA for improving reception sensitivity may be separately inserted between the planar antenna 50 and the SAW filter 230, or the SAW filter 230 may be incorporated in the GPS receiving unit 300. SAW is an abbreviation for Surface Acoustic Wave, and LNA is an abbreviation for Low Noise Amplifier.

The GPS receiving unit 300 processes the satellite signal that has passed through the SAW filter 230, and includes an RF circuit 310, a baseband circuit 320, and a crystal oscillator unit 330 with a temperature compensation circuit. RF is an abbreviation for Radio Frequency. In the following description and FIG. 2, the crystal oscillator unit with the temperature compensation circuit is referred to as TCXO.

The TCXO 330 and a flash memory 340 are coupled to the baseband circuit 320.

Since the RF circuit 310 is a general RF circuit for GPS reception including a PLL, a VCO, an LNA, a mixer, an IF amplifier, an IF filter, an A/D converter, and the like, description thereof will be omitted. PLL is an abbreviation for Phase Locked Loop, VCO is an abbreviation for Voltage Controlled Oscillator, and IF is an abbreviation for Intermediate Frequency.

The baseband circuit 320 includes a decoding circuit 321 that decodes a reception signal, as a result of conversion into a digital signal, from the RF circuit 310, and a frequency dividing circuit 322 that divides the frequency of an oscillation signal oscillated in the TCXO 330 and outputs the resultant signal as a clock signal to the RF circuit 310 and the control indication unit 400. A frequency dividing circuit 322 includes a plurality of stages of frequency dividers and thus can output clock signals having a plurality of frequencies.

The decoding circuit 321 receives the reception signal from the RF circuit 310, performs correlation processing, positioning calculation, and the like to obtain satellite time information and positioning data, and corrects the acquired satellite time information, that is, the Z count, using the UTC offset data (leap second) 344 stored in the flash memory 340 to calculate the UTC which is the coordinated universal time, as time data. Thus, the baseband circuit 320 outputs the positioning data and the time data to a CPU 410.

The TCXO 330 is, for example, a temperature compensated crystal oscillator unit featuring a high frequency that is 26 MHz or higher and having high-precision high-frequency characteristics. The TCXO 330 supplies the clock on which a local oscillation signal is based, to the RF circuit 310 via the frequency dividing circuit 322 of the baseband circuit 320. The frequency dividing circuit 322 supplies highly-precise clock (PPS signal) of 1 Hz is supplied to the CPU 410. PPS is an abbreviation for Pulse Per Second.

The GPS receiving unit 300 of the present embodiment has a hardware configuration in which the TCXO 330 and the frequency dividing circuit 322 can be activated and the RF circuit 310 and the decoding circuit 321 of the baseband circuit 320 can be deactivated under the temperature compensation data generation mode described below.

The flash memory 340 is configured to be accessible from the baseband circuit 320 and directly accessible from the CPU 410. Data stored in the flash memory 340 will be described below.

Control Indication Unit

The control indication unit 400 includes the CPU 410, a drive circuit 420 that drives the hands and the like, a crystal oscillator unit 430 using a crystal oscillator 431, and a temperature sensor 440. The configuration of the crystal oscillator unit 430 will be described below.

The CPU 410 includes an RTC 411, a ROM 412, and a RAM 413, measures time, and outputs a control signal to and thus controls the operation of the GPS receiving unit 300.

The RTC 411 measures the internal time using a reference signal based on the oscillation signal output from the crystal oscillator unit 430. In the present embodiment, the internal time measured by the RTC 411 is UTC which is the coordinated universal time. In response to successful reception under a timekeeping mode or a positioning mode, the CPU 410 updates the RTC 411 using the UTC output from the GPS receiving unit 300.

Figure 3:
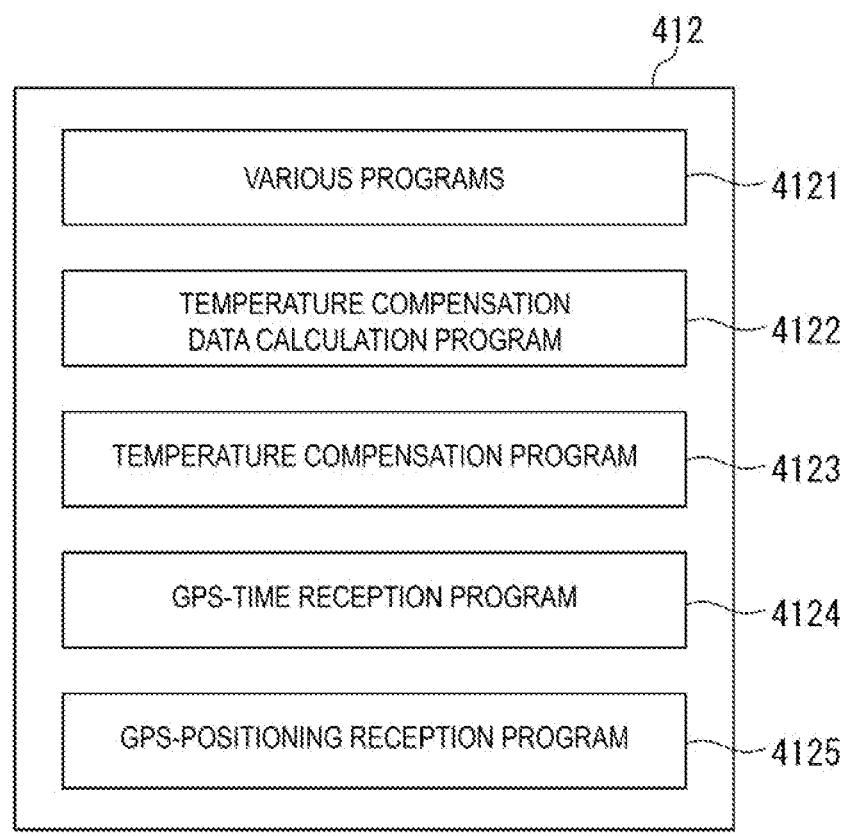
FIG. 3 is a diagram illustrating a program stored in a ROM of the radio-controlled timepiece.

The ROM 412 stores various programs executed by the CPU 410. Specifically, as illustrated in FIG. 3, the ROM 412 stores various programs 4121, a temperature compensation data calculation program 4122, a temperature compensation program 4123, a GPS-time reception program 4124, and a GPS-positioning reception program 4125.

The various programs 4121 are various programs for implementing the functions of the timepiece, examples of which including a program for controlling the movement of the hands 3 and the like. The temperature compensation data calculation program 4122 is a program for calculating the temperature compensation data for the crystal oscillator unit 430. The temperature compensation program 4123 is a program for performing temperature compensation for the crystal oscillator unit 430. The GPS-time reception program 4124 is a program that is executed during automatic reception when a GPS-reception condition is satisfied and when a time reception operation is performed using the operating unit, for receiving the satellite signals from the GPS satellites to acquire the time information. The GPS-positioning reception program 4125 is a program that is executed when a positioning reception operation is performed by the operating unit, for receiving the satellite signals from the GPS satellites to acquire the position information and the time information.

These programs are not limited to the storage in the ROM 412, and may also be stored in the rewritable flash memory 340.

The RAM 413 stores, for example, various types of data necessary for executing the various programs, such as temperature data measured by the temperature sensor 440.

Figure 4:
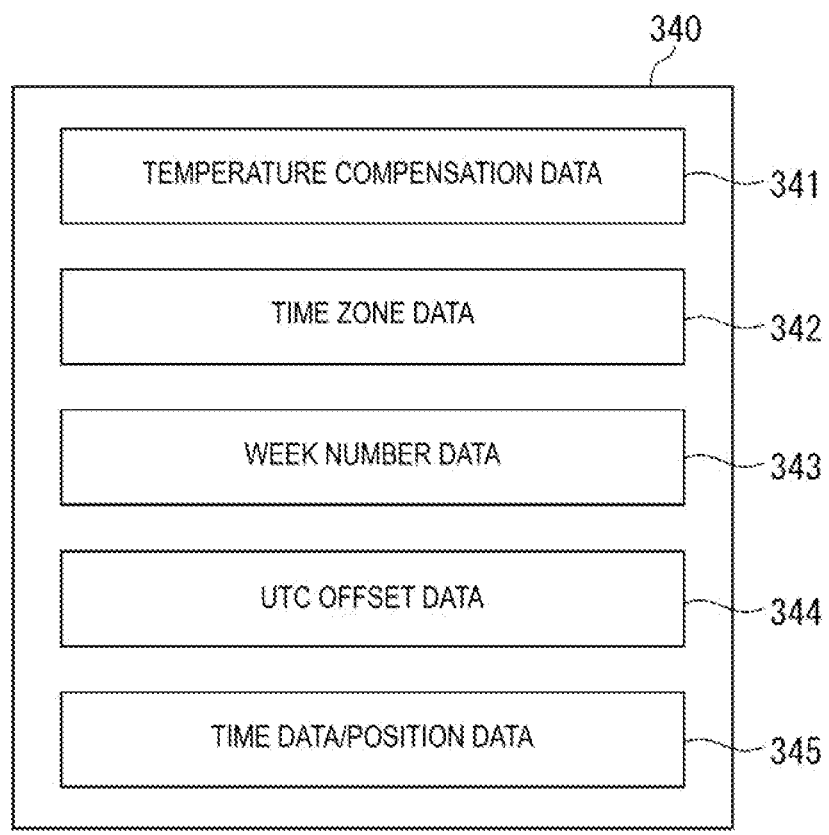
FIG. 4 is a diagram illustrating data stored in a flash memory of the radio-controlled timepiece.

As illustrated in FIG. 4, the flash memory 340 stores temperature compensation data 341, time zone data 342, week number data 343, UTC offset data 344, and time data/position data 345 most currently received.

The temperature compensation data 341 is temperature compensation data for the crystal oscillator unit 430 calculated by the temperature compensation data calculation program 4122.

The time zone data 342 is data in which position information specified by latitude and longitude is associated with time difference information of the location. Therefore, when the GPS-positioning reception program 4125 operates the GPS receiving unit 300 to acquire the position information under the positioning mode, the GPS-position receiving program 122 acquires the time difference information, that is, a time difference with respect to UTC from the time zone data 342 based on the position information (latitude, longitude) and stores the time difference information in the RAM 413.

The week number data 343 is data in which a week number (WN) included in the GPS satellite signal and the date are associated with each other. The week number data 343 is provided to prevent a rollover of the week number that otherwise occurs every 1024 weeks.

The UTC offset data 344 is leap second data for correcting the GPS time acquired from the GPS satellite signal to UTC, is written in the factory at the time of shipment of the radio-controlled timepiece 1, and when the UTC offset data 344 is acquired through reception from the GPS satellite signal, is updated with the data.

In the time data/position data 345, the GPS time and position information acquired in the most current reception processing are stored. Thus, the position data is the position data most recently received successfully by the GPS-positioning reception program 4125, and the time data is the GPS time data most recently received successfully by the GPS-time reception program 4124 or the GPS-positioning reception program 4125.

Thus, the flash memory 340 stores the satellite time information, the positioning information, and the time difference information output from the GPS receiving unit 300. Therefore, the CPU 410 calculates the time at the current location based on the UTC and the time difference information, drives the stepping motor 421 described below by the drive circuit 420, to indicate the calculated time using the hour hand 31, the minute hand 32, and the seconds hand 33.

The temperature sensor 440 is formed by using, for example, a CR oscillation circuit, and measures the temperature in the case 10 in which the crystal oscillator unit 430 is disposed, based on the oscillation frequency that changes in accordance with the temperature characteristics of the CR oscillation circuit.

In the present embodiment, the crystal oscillator unit 430 serves as a first oscillating unit that oscillates at a first frequency to output the clock signal, and the TCXO 330 serves as a second oscillating unit that is less temperature-dependent in terms of frequency than the crystal oscillator unit 430 serving as the first oscillating unit and oscillates at a second frequency to output the clock signal. The RTC 411 serves as a time measuring unit that operates using, as the reference, the clock signal from the crystal oscillator unit 430 serving as the first oscillating unit, and the GPS receiving unit 300 serves as a receiving unit including the TCXO 330 serving as the second oscillating unit and receives radio waves including the time information.

The temperature sensor 440 serves as a temperature acquiring unit that acquires the temperature data. The CPU 410 serves as a control unit that calculates the temperature compensation data for the crystal oscillator unit 430 serving as the first oscillating unit. The flash memory 340 serves as a storage unit that stores the temperature compensation data.

Power Supply Unit

As illustrated in FIG. 2, the power supply unit 500 supplying power to the GPS receiving unit 300 and the control indication unit 400 includes a solar panel 25, a charge control circuit 510, the secondary battery 24, a first voltage conversion unit 520, a second voltage conversion unit 530, and a voltage detection circuit 540.

The charge control circuit 510 performs control to charge the secondary battery 24 with electric power generated by the solar panel 25.

The secondary battery 24 supplies driving power to the control indication unit 400 via the first voltage conversion unit 520, and supplies driving power to the GPS receiving unit 300 via the second voltage conversion unit 530.

The voltage detection circuit 540 monitors the output voltage from the secondary battery 24 and outputs the voltage to the CPU 410. Therefore, the CPU 410 can control the reception processing while recognizing the voltage of the secondary battery 24 detected by the voltage detection circuit 540.

Temperature Compensation for Crystal Oscillator Unit

Figure 5:
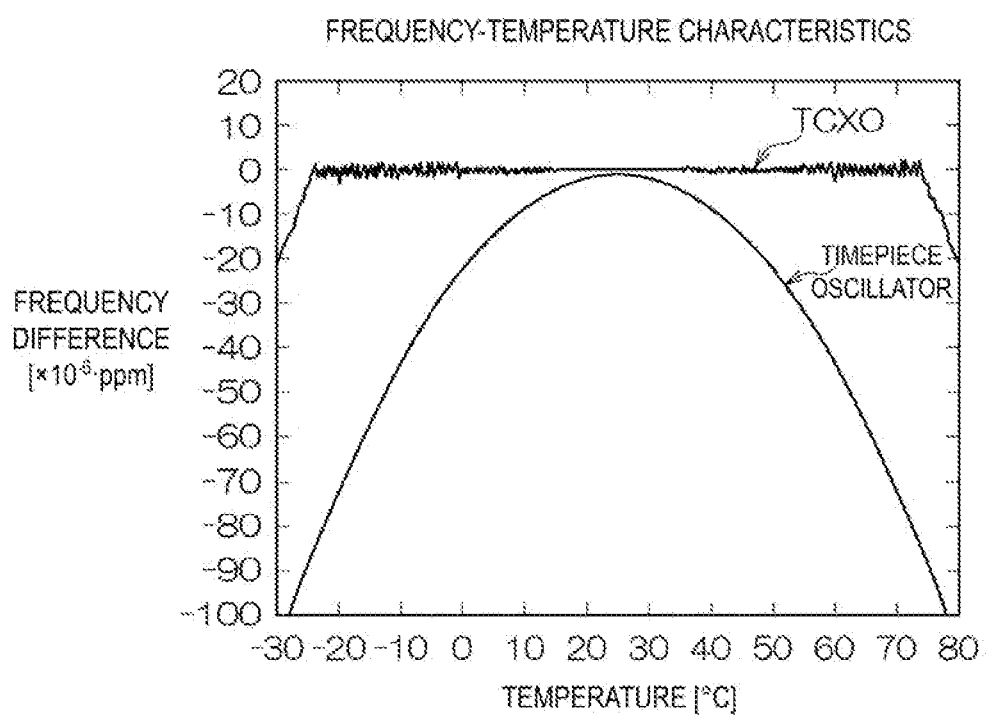
FIG. 5 is a graph illustrating frequency-temperature characteristics of a timepiece oscillator and a TCXO of the radio-controlled timepiece.

The crystal oscillator unit 430 using the low-frequency crystal oscillator 431 for a timepiece is, a timepiece oscillator with a lower frequency precision than the TCXO 330. Specifically, as can be seen from the comparison between the TCXO 330 and the crystal oscillator unit 430 in frequency-temperature characteristics as illustrated in FIG. 5, the oscillation frequency of the TCXO 330 remains substantially constant, that is, barely varies even when the temperature changes. On the other hand, the oscillation frequency of the crystal oscillator unit 430 varies when the temperature changes, and thus largely varies compared with that of the TCXO 330 in response to the temperature change.

Since the power consumption of the TCXO 330 is larger than that of the crystal oscillator unit 430 and thus it is difficult to cause the TCXO 330 to constantly operate considering the relationship between the amount of power generated by the solar panel 25 and the power consumption of the TCXO 330, the RTC 411 measures time using the clock signal from the crystal oscillator unit 430.

Figure 6:
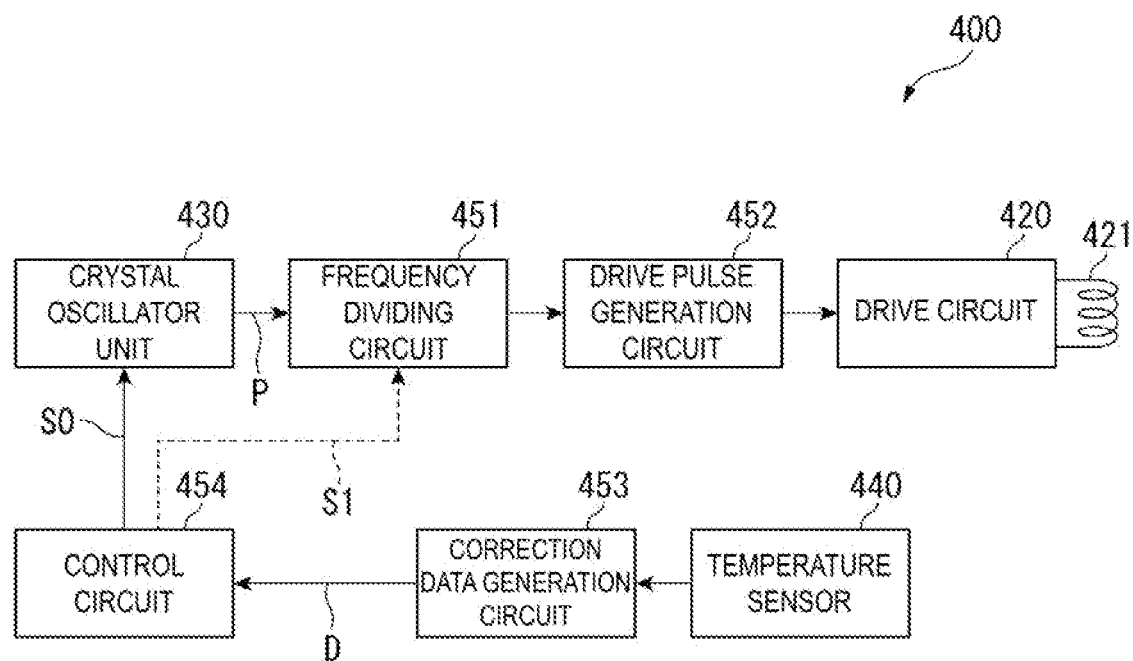
FIG. 6 is a block diagram illustrating a main part of the control indication unit of the radio-controlled timepiece.

For this reason, the radio-controlled timepiece 1 is provided with a circuit configured to perform temperature compensation for the crystal oscillator unit 430 as illustrated in FIG. 6.

FIG. 6 is a block diagram of the control indication unit 400 with a temperature compensation circuit for the crystal oscillator unit 430.

The control indication unit 400 includes: the crystal oscillator unit 430 that outputs an oscillation pulse P; a frequency dividing circuit 451 that divides the frequency of the oscillation pulse P; the drive pulse generation circuit 452 that generates a driving pulse from a frequency-divided signal output from the frequency dividing circuit 451; a drive circuit 420 that drives the stepping motor 421 based on the driving pulse; a correction data generation circuit 453 that generates correction data D for correcting the frequency of the oscillation pulse P based on the temperature data measured by the temperature sensor 440; and a control circuit 454 that outputs a control signal S0 for controlling the crystal oscillator unit 430 based on the correction data D.

Figure 7:
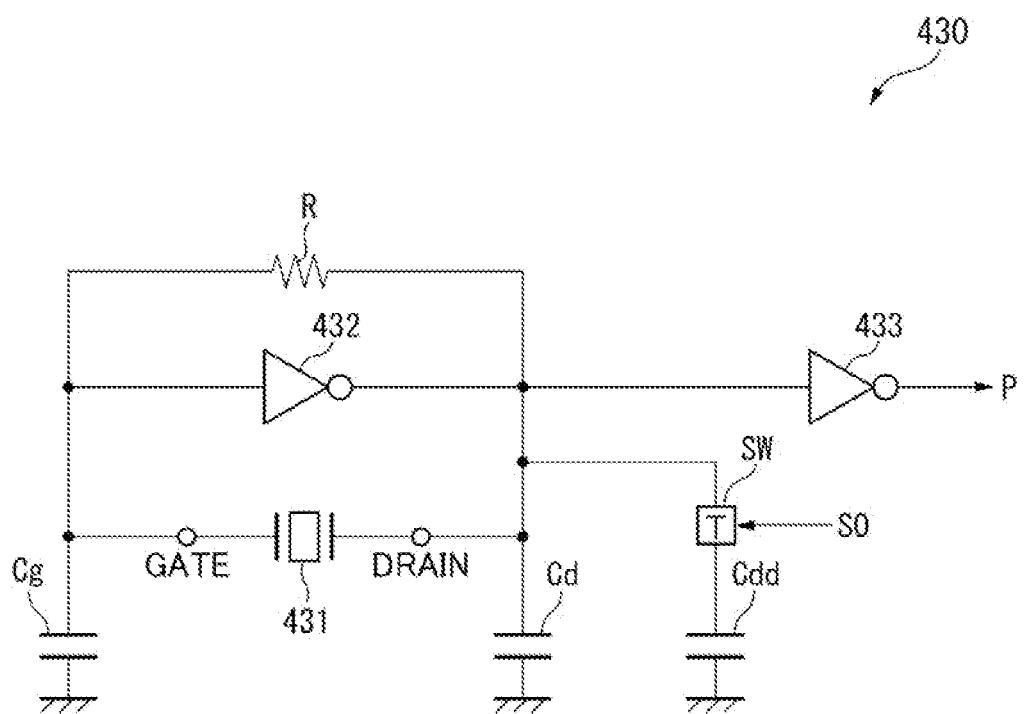
FIG. 7 is a circuit diagram illustrating a configuration of a crystal oscillator unit of the radio-controlled timepiece.

FIG. 7 is a circuit diagram of the crystal oscillator unit 430. The crystal oscillator unit 430 includes: a Colpitts oscillation circuit including the crystal oscillator 431, an oscillation inverter 432, a feedback resistor R, a gate-side capacitor Cg, and a drain-side capacitor Cd; an inverting amplifier 433 that inverts and amplifies an oscillation pulse output from the Colpitts oscillation circuit; and a capacitor Cdd that has a capacitance CO and is coupled in parallel to the drain-side capacitor Cd via a switch SW. Thus, in the crystal oscillator unit 430, when the switch SW is OFF, the drain-side capacitor is the capacitance of the capacitor Cd, whereas when the switch SW is ON, the drain-side capacitor is the sum of the capacitance of the capacitor Cd and the capacitance of the capacitor Cdd. With this configuration, the frequency of the oscillation pulse P output from the crystal oscillator unit 430 is inversely proportional to the capacitance of the crystal oscillator unit 430, meaning that the frequency when the switch SW is ON is lower than the frequency when the switch SW is OFF.

The control signal S0 output from the control circuit 454 is for control to change the ratio between the time during which the capacitor Cdd for adjustment is coupled on the drain side and the time during which the capacitor Cdd is not coupled, within a predetermined period of time (10 seconds for example). Thus, the average frequency of the oscillation pulse P output from the crystal oscillator unit 430 within the predetermined period of time can be adjusted in detail, the frequency of the oscillation pulse P can be corrected to a set frequency, whereby the time can be accurately measured. The set frequency of the crystal oscillator unit 430 for a timepiece is generally 32768 Hz.

The crystal oscillator unit 430 is not limited to the circuit illustrated in FIG. 7. For example, the frequency of the oscillation pulse P may be adjusted in detail by changing the number of the adjustment capacitors coupled to the drain.

The temperature compensation method for the crystal oscillator unit 430 is not limited to the method of adjusting the frequency of the oscillation signal by controlling an additional capacitance of the oscillation circuit. Logical regulation may be employed with which the signal change timing of the reference signal output from the frequency dividing circuit 451 is changed by controlling the frequency dividing circuit 451. Furthermore, the frequency regulation and the logical regulation may be employed in combination. When logical regulation is employed, as indicated by a dotted line in FIG. 6, the control circuit 454 outputs a control signal S1 to control the frequency dividing circuit 451.

Temperature Compensation Data Calculation Method

Next, a method of calculating the temperature compensation data for the crystal oscillator unit 430 will be described.

The temperature characteristics of the low-frequency crystal oscillator unit 430 for a timepiece vary from one crystal oscillator unit 430 to another, and also vary depending on the state in which the crystal oscillator unit 430 is incorporated in the radio-controlled timepiece 1. Thus, the temperature compensation data needs to be calculated for the crystal oscillator unit 430 and to be written in the flash memory 340 at the time of shipment inspection after completion of the radio-controlled timepiece 1.

A method of calculating the temperature compensation data for the crystal oscillator 431 will be briefly described.

Figure 8A:
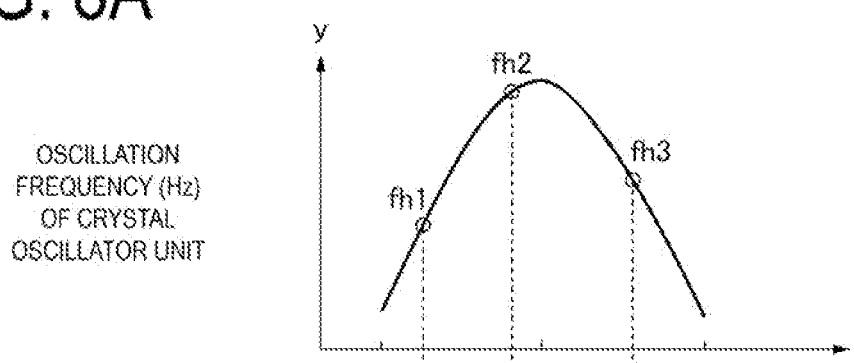
FIGS. 8A and 8B are diagrams for illustrating a method of calculating temperature compensation data for the radio-controlled timepiece.
Figure 8B:
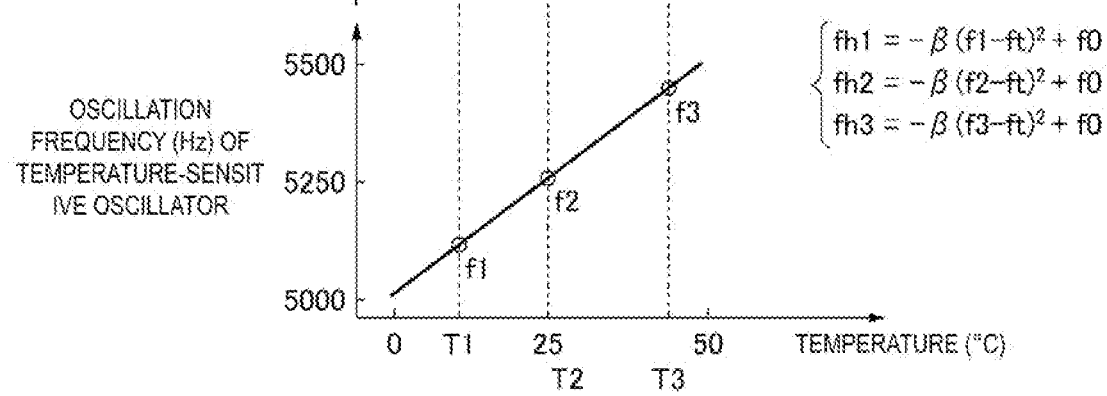

FIG. 8A illustrates the temperature characteristics of the crystal oscillator unit 430, and FIG. 8B illustrates the temperature characteristics of a temperature-sensitive oscillator serving as the temperature sensor 440.

The rate of the radio-controlled timepiece 1 is obtained by the following equation:

$$\text{Rate} = k*(fh-fr)/fr$$

where fh is the oscillation frequency of the crystal oscillator unit 430, fr is the ideal reference frequency (32768 Hz) of the crystal oscillator unit 430, and k is a constant used when converting frequency into rate and satisfies k=86400 [sec] (=24*60*60 [sec]). As described above, the rate of the radio-controlled timepiece 1 increases in proportion to a difference between the oscillation frequency output from the crystal oscillator unit 430 and the reference frequency which is the ideal value of the oscillation frequency output from the crystal oscillator unit 430, and the oscillation frequency of the crystal oscillator unit 430 varies with temperature. Thus, temperature compensation needs to be performed. The frequency-temperature characteristics of the crystal oscillator unit 430 are represented by a quadratic curve as illustrated in FIG. 5 and FIG. 8A. Thus, the temperature compensation data may be calculated by measuring an oscillation frequency fh of the crystal oscillator 431 at three temperatures T1, T2, and T3.

Specifically, the radio-controlled timepiece 1 is held at the temperature T1 for a predetermined period of time (for example, three hours), and when the radio-controlled timepiece 1 reaches a constant temperature state, an oscillation frequency f1 of the temperature sensor 440 and an oscillation frequency fh1 of the crystal oscillator unit 430 are measured.

Next, the radio-controlled timepiece 1 is held at the temperature T2 for a predetermined period of time (for example, three hours), and when the radio-controlled timepiece 1 reaches a constant temperature state, an oscillation frequency f2 of the temperature sensor 440 and an oscillation frequency fh2 of the crystal oscillator unit 430 are measured.

Then, the radio-controlled timepiece 1 is held at the temperature T3 for a predetermined period of time (for example, three hours), and when the radio-controlled timepiece 1 reaches a constant temperature state, an oscillation frequency f3 of the temperature sensor 440 and an oscillation frequency fh3 of the crystal oscillator unit 430 are measured.

Thereafter, a coefficient R, a reference frequency ft, and a fundamental frequency f0, which are values unique to the radio-controlled timepiece 1 that satisfy all of the following Equations (1) to (3), are calculated. Then, the coefficient R, the reference frequency ft, and the fundamental frequency f0 are stored in the flash memory 340 of the radio-controlled timepiece 1 as temperature compensation data.

$$fh1 = -\beta(f1-ft)^2 + f0 \qquad (1)$$

$$fh2=-\beta(f2-ft)^2+f0 \qquad (2)$$

$$fh3=-\beta(f3-ft)^2+f0 \qquad (3)$$

Figure 9:
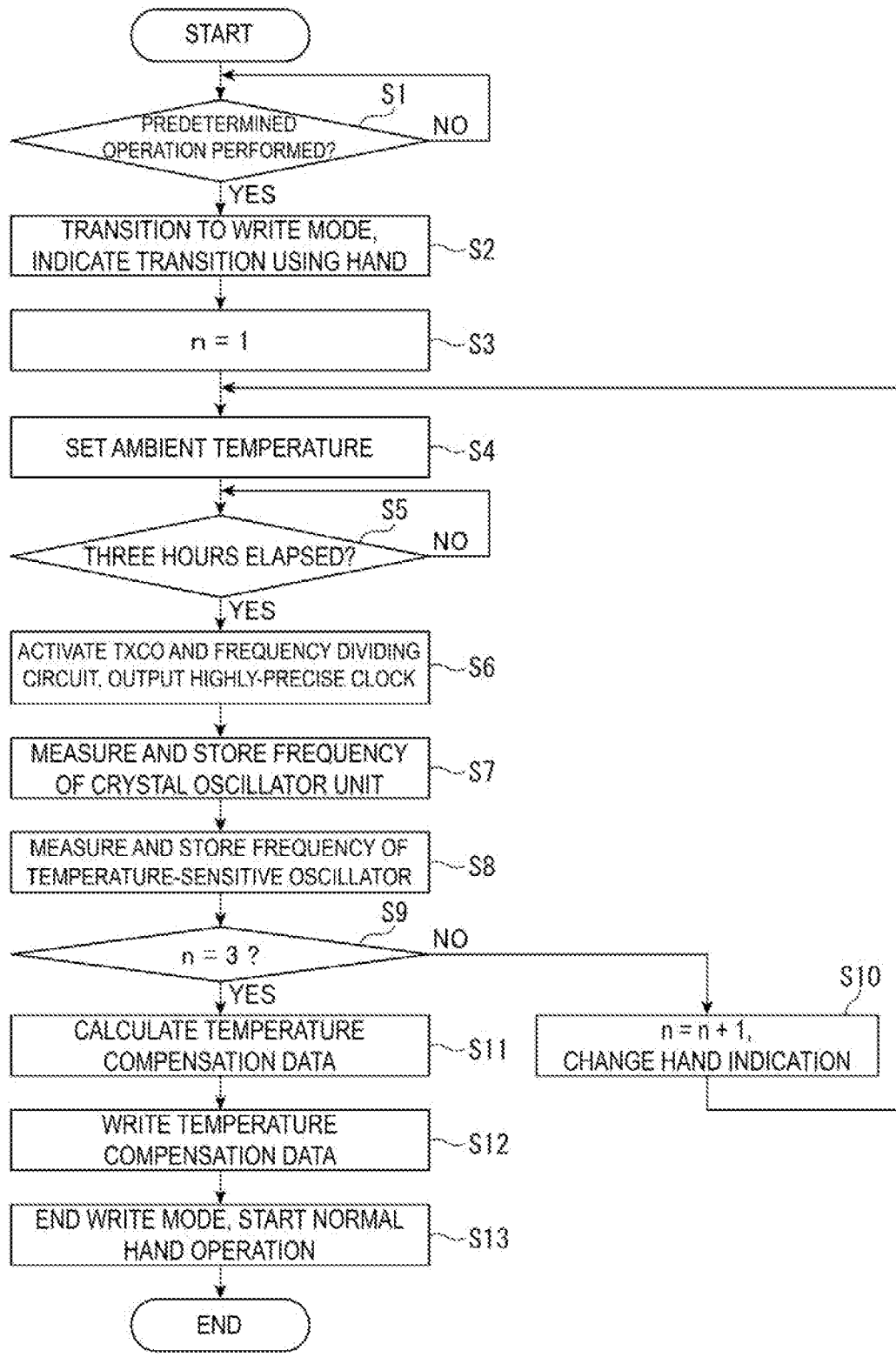
FIG. 9 is a flowchart illustrating the method of calculating the temperature compensation data for the radio-controlled timepiece.

A specific method of calculating the temperature compensation data will be described below with reference to a flowchart in FIG. 9.

The CPU 410 of the radio-controlled timepiece 1 determines whether a predetermined operation is performed for activating a write mode which is the temperature compensation data generation mode (step S1). It is determined YES in step S1 when the predetermined operation is performed by an operator by using the buttons 7 and 8 and the crown 6 of the radio-controlled timepiece 1 at the time of factory shipment after the manufacturing of the radio-controlled timepiece 1.

Upon determining YES in step S1, the CPU 410 executes the temperature compensation data calculation program 4122 to transition to the write mode under which the temperature compensation data is generated and written in the flash memory 340, and moves the hand 3 to a predetermined position to indicate that the transition to the write mode has occurred (step S2). In the present embodiment, the seconds hand 33 is sequentially moved to the 5 seconds, 10 seconds, and 15 seconds positions to indicate that the write mode is active and the number of measurements. Thus, in step S2, the seconds hand 33 is moved to and stopped at the 5 second position.

Next, the CPU 410 sets a variable n indicating the number of measurements to 1 (step S3).

Next, the operator places the radio-controlled timepiece 1 in a thermostatic chamber and sets the ambient temperature in the thermostatic chamber to a predetermined value (step S4). For example, when n=1, the ambient temperature of the thermostatic chamber is set to the temperature T1 of 8° C.

Next, the CPU 410 determines whether three hours have elapsed after setting the ambient temperature in step S4 (step S5). Whether three hours have elapsed is determined in step S5 because the inside of the radio-controlled timepiece 1 can also be set to the temperature T1 by placing the radio-controlled timepiece 1 in the thermostatic chamber for three hours.

Upon determining YES in step S5 due to the elapse of three hours, the CPU 410 activates the frequency dividing circuit 322 of the baseband circuit 320 and the TCXO 330. As a result, highly-precise clock obtained by dividing the frequency of the oscillation signal from the TCXO 330 using the frequency dividing circuit 322 is output (step S6). In the present embodiment, the highly-precise clock of 1 Hz is output to CPU 410. In step S6, the RF circuit 310 and the decoding circuit 321 stay in a deactivated state without being activated.

Next, the CPU 410 measures the frequency of the crystal oscillator unit 430 using the highly-precise clock output from the baseband circuit 320 and stores the measured frequency in the RAM 413 (step S7). The CPU 410 measures the number of pulses of the oscillation signal output from the crystal oscillator unit 430 during a measurement time, which is one second for example, set with the highly-precise clock, to measure the number of pulses, that is, the frequency per second, and stores the number of pulses, that is, the frequency in the RAM 413. When the processing in step S7 ends, the operation of the frequency dividing circuit 322 and the TCXO 330 is stopped.

The CPU 410 activates the temperature-sensitive oscillator serving as the temperature sensor 440 to measure the frequency and stores the frequency in the RAM 413 (step S8). When the processing in step S8 ends, the operation of the temperature sensors 440 is stopped.

Next, the CPU 410 determines whether n=3 (step S9). Upon determining NO in step S9, the CPU 410 adds 1 to n (n=n+1) and changes what is indicated by the hand (Step S10). When n=2, the seconds hand 33 is moved to and stopped at the 10 second position. When n=3, the seconds hand 33 is moved to and stopped at the 15 second position.

Next, the ambient temperature in the thermostatic chamber is set to the predetermined temperature again (step S4). When n=2, the ambient temperature of the thermostatic chamber is set to, for example, the temperature T2 of 23° C. When n=3, the ambient temperature of the thermostatic chamber is set to, for example, the temperature T3 of 38° C. The temperature of the thermostatic chamber may be manually set by the operator, but in the present embodiment, a control device for the thermostatic chamber is set to automatically change the temperature every three hours.

Thereafter, the CPU 410 repeats the processing in steps S9 to S10 until it is determined YES in step S5. Thus, the frequencies f1, f2, and f3 of the temperature-sensitive oscillator which is the temperature sensors 440 and the frequencies fh1, fh2, and fh3 of the oscillation signal of the crystal oscillator unit 430 are automatically measured every three hours with the temperatures T1, T2 and T3 of three levels set, and stored in the RAM 413.

Upon determining YES in step S9, the CPU 410 calculates the coefficient β, the reference frequency ft, and the fundamental frequency f0 that satisfy all of the Equations (1) to (3) as the temperature compensation data for the crystal oscillator unit 430 by using the data stored in the RAM 413 (step S11).

Next, the CPU 410 writes and stores the calculated temperature compensation data 341 in the flash memory 340 (step S12).

Next, the CPU 410 ends the write mode and resumes the normal hand operation of the hands 3 including the seconds hand 33 (step S13).

Temperature Compensation for Crystal Oscillator Unit

A process of performing rate adjustment for the crystal oscillator unit 430 by actually performing the temperature compensation based on the temperature compensation data calculated as described above will be described below. The CPU 410 executes the temperature compensation program 4123 at an interval, which is once in every 160 seconds for example, shorter than an interval (24 hours in general) at which an automatic reception operation is performed, and measures the temperature with the temperature sensor 440. Since the temperature sensor 440 is a temperature-sensitive oscillator, the measured temperature is obtained as a frequency fk of the temperature-sensitive oscillator.

Next, the CPU 410 substitutes the oscillation frequency fk of the temperature-sensitive oscillator and the temperature compensation data (the coefficient β, the reference frequency ft, and the fundamental frequency f0) stored in the flash memory 340 into the following Equation (4) to obtain a frequency fh of the oscillation signal of the crystal oscillator unit 430.

$$Fh=-\beta(fk-ft)^2+f0 \qquad (4)$$

The correction data generation circuit 453 outputs the correction data D to the control circuit 454 based on the obtained frequency fh of the crystal oscillator unit 430, and the control circuit 454 outputs the control signal S0 to the crystal oscillator unit 430 to control the crystal oscillator unit 430, thereby adjusting the frequency of the oscillation signals output from the crystal oscillator unit 430. Specifically, the correction data generation circuit 453 outputs the correction data D corresponding to the frequency difference between the frequency fh of the crystal oscillator unit 430 and an ideal frequency fr (32768 HZ) of the crystal oscillator unit 430, and the control circuit 454 outputs the control signal S0 corresponding to the correction data D to the crystal oscillator unit 430. Thus, the average frequency of the oscillation signal output from the crystal oscillator unit 430 is adjusted to be the ideal frequency fr.

As described above, at the time of factory shipment of the radio-controlled timepiece 1, the buttons 7 and 8 and the crown 6 are operated to make the radio-controlled timepiece 1 transition to the write mode and the radio-controlled timepiece 1 is placed in the thermostatic chamber. Then, the ambient temperature of the thermostatic chamber is changed every three hours among three stages, that is, the temperatures T1, T2, and T3. Thus, the CPU 410 can automatically perform processing of measuring the data for calculating the temperature compensation data and the calculation processing, and write the resultant data in the flash memory 340. Thus, with the temperature switching processing for the thermostatic chamber automated, the operator can calculate the temperature compensation data for each radio-controlled timepiece 1 and write the data in the flash memory 340 only by performing the operation of transition to the write mode and placing the resultant radio-controlled timepiece 1 in the thermostatic chamber.

Effects of First Embodiment

According to the radio-controlled timepiece 1 of the present embodiment, since the frequency of the oscillation signal of the crystal oscillator unit 430 is measured using the highly-precise clock output from the TCXO 330 of the GPS receiving unit 300, the temperature compensation data can be created within the radio-controlled timepiece 1. Thus, the temperature compensation data does not need to be calculated using a large-scale external device as in the known cases, whereby the cost for generating the temperature compensation data can be significantly reduced.

Under the temperature compensation data generation mode (write mode), the RF circuit 310 of the GPS receiving unit 300 and the decoding circuit 321 of the baseband circuit 320 are deactivated, and only the TCXO 330 and the frequency dividing circuit 322 necessary for outputting a highly-precise clock are activated. Thus, the current consumption can be reduced to ⅕ of that during the satellite signal reception, whereby the consumption of the secondary battery 24 can be suppressed.

Since the TCXO 330 provided in the GPS receiving unit 300 is used as the second oscillating unit, a highly precise clock signal can be output to the CPU 410 with very little variation due to temperature, and the oscillation frequency of the crystal oscillator unit 430, which is the first oscillating unit, can be measured highly precisely. Thus, highly precise temperature compensation data can be calculated.

Since the seconds hand 33 and the dial 2 are provided as the indication unit for indicating the temperature compensation data generation mode, the operator can easily recognize the transition to the temperature compensation data generation mode at a timing of placing the radio-controlled timepiece 1 in the thermostatic chamber and the like, and the temperature compensation data can be reliably generated.

Since the temperature compensation is performed at an interval, which is 160 second interval for example, shorter than the interval at which the automatic reception operation is performed, the time indication accuracy can be maintained by the temperature compensation, the reception frequency can be reduced, and the power consumption can also be reduced.

Second Embodiment

Figure 10:
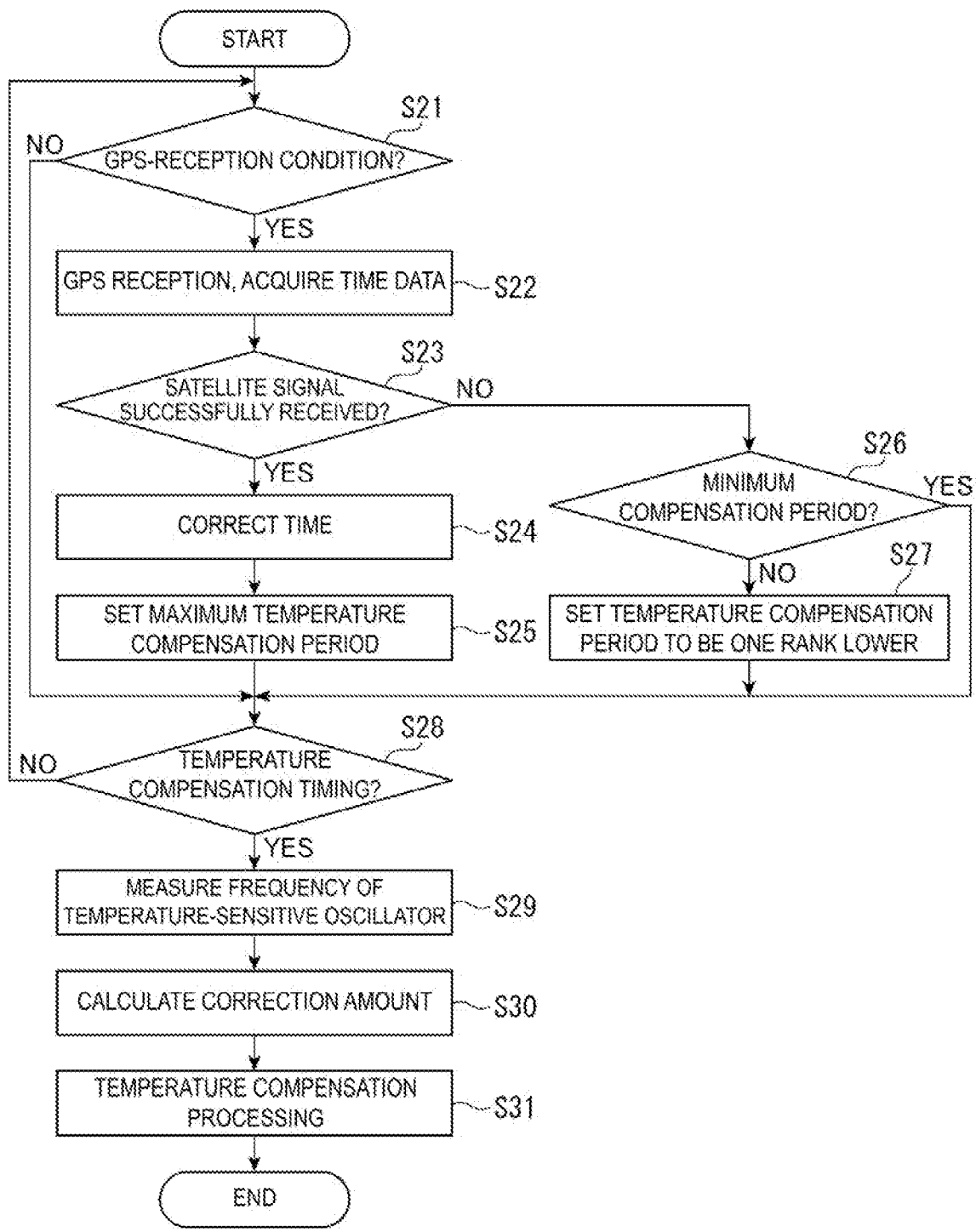
FIG. 10 is a flowchart illustrating a temperature compensation operation by the radio-controlled timepiece.

A second embodiment is different from the first embodiment where the radio-controlled timepiece 1 performs the temperature compensation using the temperature compensation program 4123 at a regular interval, in that the temperature compensation execution interval varies depending on the reception result of the GPS satellite signal. The temperature compensation of the second embodiment will be described with reference to a flowchart in FIG. 10. The configuration of the radio-controlled timepiece 1, the method of generating the temperature compensation data, and the like are similar to those in the first embodiment, thus descriptions thereof will be omitted.

The CPU 410 of the radio-controlled timepiece 1 determines whether a GPS-reception condition is satisfied during the normal hand operation (step S21). The GPS-reception condition is an automatic reception condition that is determined by the CPU 410 to be satisfied when a predetermined period of time (24 hours for example) has elapsed from the previous reception, the power generation amount of the solar panel 25 is equal to or larger than a threshold, and the radio-controlled timepiece 1 is detected to be located outdoors.

Upon determining YES in step S21 with the GPS-reception condition satisfied, the CPU 410 executes the GPS-time reception program 4124, activates the GPS receiving unit 300 to perform GPS reception processing, and acquires the time data (step S22).

Next, the CPU 410 determines whether the GPS satellite signal has been successfully received (step S23). Upon determining YES in step S23, the CPU 410 corrects time (step S24). Then, the CPU 410 sets a temperature compensation period to the maximum value (step S25). In the present embodiment, the temperature compensation period can be set to be four ranks that are 640 seconds, 320 seconds, 160 seconds, and 80 seconds, with the maximum value being 640 seconds and the minimum value being 80 seconds.

Upon determining NO in step S23, the CPU 410 determines whether the temperature compensation period is set to the minimum (step S26). Upon determining NO in step S26, the CPU 410 sets the temperature compensation period to a period that is one rank lower (step S27). Upon determining YES in step S26, the CPU 410 does not change the temperature compensation period, and thus, maintains the period.

Since the reception may suddenly fail, the condition may be set so that it is determined NO in step S23 when the reception fails two consecutive times.

When it is determined NO in step S21, when the temperature compensation period is set in steps S25 and S27, and when it is determined YES in step S26 to maintain the temperature compensation period, the CPU 410 determines whether the temperature compensation timing has arrived (step S28). For example, when the temperature compensation period is set to 640 seconds in step S25 which is the maximum value, the CPU 410 determines Yes in step S28 at a timing when 640 seconds have elapsed after the execution of the previous temperature compensation. Thus, in step S28, the CPU 410 determines whether the temperature compensation timing has arrived based on the currently set temperature compensation period.

Upon determining NO in step S28, the CPU 410 returns to step S21 and continues the processing.

On the other hand, upon determining YES in step S28, the CPU 410 activates the temperature-sensitive oscillator which is the temperature sensor 440 and measures the frequency thereof (step S29). Specifically, the ambient temperature of the crystal oscillator unit 430 is measured.

The CPU 410 substitutes the measured frequency fk of the temperature-sensitive oscillator into Equation (4) described above to obtain the frequency fh of the oscillation signal of the crystal oscillator unit 430, and calculates the correction amount based on this frequency fh (step S30).

The CPU 410 performs temperature compensation for the crystal oscillator unit 430 based on the calculated correction amount (step S31). Specifically, the frequency of the clock signal output from the frequency dividing circuit 451 is adjusted by switching the capacitance of the capacitor of the oscillation circuit or performing logical regulation of the frequency dividing circuit 451.

Effects of Second Embodiment

With the radio-controlled timepiece 1 of the second embodiment, the same operations and effects as in the first embodiment can be acquired.

In addition, the temperature compensation period varies based on the GPS reception result, so that the power consumption can be maintained while maintaining time precision.

Specifically, when the GPS satellite signal is successfully received, the temperature compensation period is set to the maximum value, meaning that the interval at which the temperature compensation is performed is lengthened and the number of times the temperature sensor 440 is activated is reduced. Thus, the power consumption can be reduced. Generally, the precision of the crystal oscillator 431 is about ±15 seconds per month, and the deviation amount per day is 0.5 seconds or less. On the other hand, the time information of the GPS satellite signal is synchronized with the atomic clock mounted in the GPS satellite, with high time precision of about $1 \times 10^{-13}$, and the time can be corrected to precise time when the information is successfully received. Therefore, as long as the satellite signal is successfully received on a regular basis, such as once a day, deterioration in time precision can be prevented even if the temperature of the crystal oscillator unit 430 is compensated at a longer interval. With the temperature compensation performed at a longer interval, the interval at which the temperature sensor 440 is activated can be longer, and thus the consumed current can be reduced accordingly.

When the reception of the satellite signal fails, the temperature compensation execution interval is shortened in a stepwise manner, so that deterioration in time precision can be suppressed.

Other Embodiments

The present disclosure is not limited to the above-described embodiments, and various modifications can be made within the scope of the present disclosure.

In the above-described embodiments, the transition to the temperature compensation data generation mode occurs when a predetermined operation is performed on the operating unit such as the buttons 7 and 8 or the crown 6. Alternatively, the transition to the temperature compensation data generation mode need not be triggered by the predetermined operation on the operating unit, and may occur automatically. For example, the radio-controlled timepiece 1 may be configured to receive the control signal from the external, and transition to the temperature compensation data generation mode automatically upon receiving the control signal instructing the transition to the temperature compensation data generation mode. In this case, after the radio-controlled timepiece 1 is placed in the thermostatic chamber, the transition to the temperature compensation data generation mode, the temperature setting of the thermostatic chamber, and the like can be automatically performed. Thus, the work of the operator at the time of shipment inspection can be reduced.

Furthermore, an inspection robot may be used for fully automating the predetermined operation on the operating unit and the placing of the radio-controlled timepiece 1 in the thermostatic chamber, so that the shipping inspection can be automated.

In addition, the indication unit for indicating the temperature compensation data generation mode need not necessarily be provided. In particular, when the transition to the temperature compensation data generation mode automatically occurs, the operator needs not to check the mode transition, and thus the indication unit is not required.

While the decoding circuit 321 of the baseband circuit 320 is deactivated under the temperature compensation data generation mode in the above embodiment, the baseband circuit 320 may be activated without deactivating the decoding circuit 321, or the RF circuit 310 may be activated in addition to the baseband circuit 320. Specifically, when the GPS receiving unit 300 is partially deactivated under the temperature compensation data generation mode, a new hardware configuration for deactivating a part of the circuits and operating the other circuits is required. On the other hand, when the baseband circuit 320 and the RF circuit 310 are activated under the temperature compensation data generation mode, no new hardware configuration for deactivating the part of the circuits is required. Thus, it is only required to enable an existing radio-controlled timepiece to output the highly-precise clock signal from the GPS receiving unit 300 to the CPU 410 and add the temperature compensation data calculation program 4122. Thus, the radio-controlled timepiece 1 having the temperature compensation data generation mode can be configured at a low cost.

Since the highly-precise signal output from the GPS receiving unit 300 to the CPU 410 is used to set the time for measuring the frequency of the oscillation signal of the crystal oscillator unit 430, the highly-precise clock signal is not limited to the PPS signal of the embodiment, that is, the pulse signal output every second, but may be a signal lower than 1 Hz or a signal that is 1 Hz or higher as long as the clock signal can be used for measuring frequency of the oscillation signal of the crystal oscillator unit 430. The radio-controlled timepiece 1 is not limited to an analog timepiece including the hands 3, but may be a digital timepiece that displays the time on a display. Specifically, the hardware configuration of the radio-controlled timepiece 1 and the highly-precise clock signal output from the GPS receiving unit 300 are not limited to those in the above-described embodiment, and other configurations may be used.

In the above-described embodiments, the reception unit is the GPS receiving unit 300 that receives a satellite signal (radio waves) transmitted from GPS satellites, but the radio waves received by the receiving unit are not limited to this. For example, satellite signals transmitted from satellites of other global navigation satellite systems (GNSS) such as Galileo, GLONASS, and Beidou, a geosynchronous satellite navigation augmentation system (SBAS), and a regional satellite positioning system (RNSS) configured to search only in a specific region such as a quasi-zenith satellite may be received.

The receiving unit is not limited to those that receive satellite signals, and may be any unit that receives radio waves including time information, such as Bluetooth (trade name), Bluetooth Low Energy (BLE), Wi-Fi (trade name), Near Field Communication (NFC), or Low Power Wide Area (LPWA) for example, and includes the second oscillating unit.

Summary of Present Disclosure

A radio-controlled timepiece according to the present disclosure includes a first oscillating unit configured to oscillate at a first frequency and output a clock signal, a time measuring unit configured to operate using, as a reference, the clock signal, a receiving unit including a second oscillating unit and configured to receive radio waves including time information, frequency of the second oscillating unit being less temperature-dependent than that of the first oscillating unit and the second oscillating unit being configured to oscillate at a second frequency and output a clock signal, a temperature acquiring unit configured to acquire temperature data, a control unit configured to calculate temperature compensation data for the first oscillating unit based on an oscillation frequency of the first oscillating unit obtained using, as a reference, the clock signal output from the second oscillating unit and on the temperature data acquired by the temperature acquiring unit, and a storage unit configured to store the temperature compensation data calculated, wherein the control unit performs temperature compensation for the first oscillating unit based on the temperature compensation data stored in the storage unit and the temperature data acquired by the temperature acquiring unit.

Since the temperature compensation data is calculated with the frequency of the oscillation signal of the first oscillating unit measured using the clock signal output from the second oscillating unit of the receiving unit and stored in the storage unit, no external device is required for calculating the temperature compensation data. Thus, the temperature compensation data for the first oscillating unit can be calculated easily and at a low cost.

In the radio-controlled timepiece according to the present disclosure, the radio waves may be radio waves transmitted from a positioning satellite.

The receiving unit that receives the radio waves transmitted from the positioning satellite such as GPS is provided with a TCXO serving as a local oscillator, and the TCXO can be used as the second oscillating unit. Thus, variation of the second oscillating unit due to temperature is extremely small, whereby a highly-precise clock signal can be output. Furthermore, the frequency of the oscillation signal of the first oscillating unit can be highly precisely measured. Thus, the temperature compensation data can be calculated with high precision.

In the radio-controlled timepiece according to the present disclosure, the control unit may include a temperature compensation data generation mode under which the temperature compensation data is calculated in a state where the second oscillating unit is caused to operate, and an operation of at least part, of the receiving unit, not involved in the outputting of the clock signal from the second oscillating unit is stopped.

Under the temperature compensation data generation mode, the radio waves do not need to be received, and thus at least part, of the receiving unit, not involved in the outputting of the clock signal from the second oscillating unit can be deactivated. For example, only the frequency dividing circuit that divides the frequency of the oscillation signal from the second oscillating unit needs to operate in the receiving unit. In other words, the RF circuit, the decoding circuit of the baseband circuit, and the like can be deactivated. Thus, the power consumed during the temperature compensation data generation can be reduced, whereby the battery consumption can be suppressed.

The radio-controlled timepiece according to the present disclosure may further include an indication unit configured to indicate that the temperature compensation data generation mode is active.

With the indication unit for indicating the temperature compensation data generation mode provided, the operator can recognize the transition to the temperature compensation data generation mode at the timing of placing the radio-controlled timepiece in the thermostatic chamber and the like, and the temperature compensation data can be reliably generated.

In the radio-controlled timepiece according to the present disclosure, the control unit may perform the temperature compensation at an interval shorter than an interval at which an automatic reception operation of activating the receiving unit and acquiring the time information is performed, the automatic reception operation be performed on satisfaction of a predetermined automatic reception condition.

Since the temperature compensation is performed at an interval shorter than the interval at which the automatic reception operation is performed, the time indication accuracy can be maintained by the temperature compensation, the reception frequency can be reduced, and the power consumption can also be reduced.

In the radio-controlled timepiece according to the present disclosure, the control unit may change an interval at which the temperature compensation for the first oscillating unit is performed, depending on whether the reception of the time information by the receiving unit succeeds or fails.

When the time information is successfully received, the time indicated by the radio-controlled timepiece can be corrected to the precise time using the received time information. Thus, a longer temperature compensation execution interval can be set, so that the power consumption can be reduced. A shorter temperature compensation execution interval can be set when the reception of the time information fails. Thus, the time can be indicated by the radio-controlled timepiece with a higher precision than in a case of a longer temperature compensation interval.

A control method for a radio-controlled timepiece according to the present disclosure is a control method for a radio-controlled timepiece, the radio-controlled timepiece including: a first oscillating unit configured to oscillate at a first frequency and output a clock signal, a time measuring unit configured to operate using, as a reference, the clock signal, a receiving unit including a second oscillating unit and configured to receive radio waves including time information, frequency of the second oscillating unit being less temperature-dependent than that of the first oscillating unit and the second oscillating unit being configured to oscillate at a second frequency and output a clock signal, a temperature acquiring unit configured to acquire temperature data, and a storage unit configured to store temperature compensation data, the control method including: causing at least part of the receiving unit including the second oscillating unit to operate to output the clock signal from the second oscillating unit, measuring an oscillation frequency of the first oscillating unit using, as a reference, the clock signal output from the second oscillating unit, activating the temperature acquiring unit and measuring the temperature data, calculating the temperature compensation data for the first oscillating unit based on the oscillation frequency of the first oscillating unit and the temperature data, and storing the temperature compensation data in the storage unit.

Since the temperature compensation data is calculated with the frequency of the oscillation signal of the first oscillating unit measured using the clock signal output from the second oscillating unit of the receiving unit and stored in the storage unit, no external device is required for calculating the temperature compensation data. Thus, the temperature compensation data for the first oscillating unit can be calculated easily and at a low cost.

What is claimed is:

1. A radio-controlled timepiece comprising:
   a first oscillating unit configured to oscillate at a first frequency and output a first clock signal;
   a time measuring unit configured to operate using, as a first reference signal the first clock signal;
   a receiving unit including a second oscillating unit and configured to receive radio waves including time information, a second frequency of the second oscillating unit being less temperature-dependent than that of the first oscillating unit and the second oscillating unit being configured to oscillate at the second frequency and output a second clock signal;
   a temperature acquiring unit configured to acquire temperature data;
   a control unit configured to calculate temperature compensation data for the first oscillating unit based on an oscillation frequency of the first oscillating unit obtained using, as a second reference signal, the second clock signal output from the second oscillating unit and on the temperature data acquired by the temperature acquiring unit; and
   a storage unit configured to store the temperature compensation data calculated, wherein
   the control unit performs temperature compensation for the first oscillating unit, based on the temperature compensation data stored in the storage unit and the temperature data acquired by the temperature acquiring unit.

2. The radio-controlled timepiece according to claim 1, wherein
   the radio waves are radio waves transmitted from a positioning satellite.

3. The radio-controlled timepiece according to claim 1, wherein
   the control unit includes a temperature compensation data generation mode under which the temperature compensation data is calculated in a state where the second oscillating unit operates and an operation of at least part, of the receiving unit, not involved in the outputting of the second clock signal from the second oscillating unit is stopped.

4. The radio-controlled timepiece according to claim 3, further comprising
   an indication unit configured to indicate that the temperature compensation data generation mode is active.

5. The radio-controlled timepiece according to claim 1, wherein
   the control unit performs the temperature compensation at an interval shorter than an interval at which an automatic reception operation of activating the receiving unit and acquiring the time information is performed, the automatic reception operation be performed on satisfaction of a predetermined automatic reception condition.

6. The radio-controlled timepiece according to claim 1, wherein
   the control unit changes an interval at which the temperature compensation for the first oscillating unit is performed, depending on whether the reception of the time information by the receiving unit succeeds or fails.

7. A control method for a radio-controlled timepiece, the radio-controlled timepiece including:
   a first oscillating unit configured to oscillate at a first frequency and output a first clock signal,
   a time measuring unit configured to operate using, as a first reference signal, the first clock signal,
   a receiving unit including a second oscillating unit and configured to receive radio waves including time information, a second frequency of the second oscillating unit being less temperature-dependent than that of the first oscillating unit and the second oscillating unit being configured to oscillate at the second frequency and output a second clock signal,
   a temperature acquiring unit configured to acquire temperature data, and
   a storage unit configured to store temperature compensation data, the control method comprising:
   causing at least part of the receiving unit including the second oscillating unit to operate to output the second clock signal from the second oscillating unit;
   measuring an oscillation frequency of the first oscillating unit using, as a second reference signal, the second clock signal output from the second oscillating unit;
   activating the temperature acquiring unit and measuring the temperature data;
   calculating the temperature compensation data for the first oscillating unit based on the oscillation frequency of the first oscillating unit and the temperature data; and
   storing the temperature compensation data in the storage unit.

* * * * *